US012811605B2

(12) United States Patent
Sheu

(10) Patent No.: US 12,811,605 B2
(45) Date of Patent: Nov. 24, 2026

(54) CODEC SYSTEM AND ITS ENCODING CIRCUIT AND DECODING CIRCUIT

(71) Applicant: REALTEK SEMICONDUCTOR CORPORATION, Hsinchu (TW)

(72) Inventor: Jeong-Fa Sheu, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 128 days.

(21) Appl. No.: 18/964,727

(22) Filed: Dec. 2, 2024

(65) Prior Publication Data

US 2025/0192797 A1 Jun. 12, 2025

(30) Foreign Application Priority Data

Dec. 6, 2023 (TW) ................................ 112147534

(51) Int. Cl.

*H03M 7/00* (2006.01)
*H03K 23/00* (2006.01)
*H03M 7/16* (2006.01)

(52) U.S. Cl.

CPC ............ *H03M 7/16* (2013.01); *H03K 23/005* (2013.01)

(58) Field of Classification Search

CPC ............................... H03M 7/16; H03K 23/005
USPC ............................................... 341/97, 50, 51
See application file for complete search history.

(56) References Cited

U.S. PATENT DOCUMENTS

| | | | | | |
|---|---|---|---|---|---|
| 4,785,282 | A * | 11/1988 | Martell | G08G 1/0962 340/908 |
| 5,300,930 | A | 4/1994 | Burger et al. | |
| 5,982,308 | A * | 11/1999 | Bang | G11B 5/59688 |
| 6,345,008 | B1 * | 2/2002 | Williams | G06F 5/12 365/236 |
| 10,439,617 | B2 | 10/2019 | Neidengard | |
| 2010/0134332 | A1 * | 6/2010 | Basappa | H03M 7/16 341/98 |

OTHER PUBLICATIONS

OA letter of a counterpart TW application (appl. No. 112147534) mailed on Sep. 5, 2024.

Clifford E. Cummings, Sunburst Design, Inc., SNUG paper: "Simulation and Synthesis Techniques for Asynchronous FIFO Design", SNUG San Jose 2002.

* cited by examiner

*Primary Examiner* — Peguy Jean Pierre

(74) *Attorney, Agent, or Firm* — WPAT, PC

(57) ABSTRACT

A codec system includes a minimum change code generation circuit, a flag generation circuit, and a decoding circuit. The minimum change code generation circuit is configured to generate a digital code. The flag generation circuit is coupled to the minimum change code generation circuit and is configured to generate a flag according to the digital code. The decoding circuit is configured to decode the digital code according to a preset value and the flag to generate an output value.

20 Claims, 13 Drawing Sheets

| Gray code | decoded value |
|---|---|
| 000 | 0 |
| 001 | 1 |
| 011 | 2 |
| 010 | 3 |
| 110 | 4 |
| 111 | 5 |
| 101 | 6 |
| 100 | 7 |

FIG. 1 (prior art)

| Johnson counter | | | | |
|---|---|---|---|---|
| Q1 | Q2 | Q3 | Q4 | decoded value |
| 0 | 0 | 0 | 0 | 0 |
| 1 | 0 | 0 | 0 | 1 |
| 1 | 1 | 0 | 0 | 2 |
| 1 | 1 | 1 | 0 | 3 |
| 1 | 1 | 1 | 1 | 4 |
| 0 | 1 | 1 | 1 | 5 |
| 0 | 0 | 1 | 1 | 6 |
| 0 | 0 | 0 | 1 | 7 |

FIG. 2 (prior art)

| Nout | GCf FLG | GCf GC | DC |
|---|---|---|---|
| 0 | 0 | 000 | 0 |
| 1 | 0 | 001 | 1 |
| 2 | 0 | 011 | 2 |
| 3 | 0 | 010 | 3 |
| 4 | 0 | 110 | 4 |
| 0 | 1 | 110 | 4 |
| 1 | 1 | 010 | 3 |
| 2 | 1 | 011 | 2 |
| 3 | 1 | 001 | 1 |
| 4 | 1 | 000 | 0 |

| Nout | GCf | | DC |
|---|---|---|---|
| | FLG | GC | |
| 0 | 0 | 001 | 1 |
| 1 | 0 | 011 | 2 |
| 2 | 0 | 010 | 3 |
| 3 | 0 | 110 | 4 |
| 4 | 0 | 111 | 5 |
| 0 | 1 | 111 | 5 |
| 1 | 1 | 110 | 4 |
| 2 | 1 | 010 | 3 |
| 3 | 1 | 011 | 2 |
| 4 | 1 | 001 | 1 |

| Nout | GCf FLG | GCf GC | DC |
|---|---|---|---|
| 0 | 0 | 000 | 0 |
| 1 | 0 | 001 | 1 |
| 2 | 0 | 011 | 2 |
| 3 | 0 | 010 | 3 |
| 4 | 0 | 110 | 4 |
| 5 | 0 | 111 | 5 |
| 0 | 1 | 111 | 5 |
| 1 | 1 | 110 | 4 |
| 2 | 1 | 010 | 3 |
| 3 | 1 | 011 | 2 |
| 4 | 1 | 001 | 1 |
| 5 | 1 | 000 | 0 |

CODEC SYSTEM AND ITS ENCODING CIRCUIT AND DECODING CIRCUIT

BACKGROUND OF THE INVENTION

1. Field of the Invention

The present invention generally relates to encoding and decoding, and, more particularly, to a codec system based on a minimum change code.

2. Description of Related Art

FIG. 1 shows the 3-bit Gray code and its corresponding decoded values.

FIG. 2 shows a conventional 4-bit Johnson counter and its corresponding decoded values. The Gray code and the Johnson counter are both types of minimum change codes. Since the characteristics and advantages of the minimum change code are well known to people having ordinary skill in the art, further elaboration is omitted for brevity. However, because the conventional Gray code and the conventional Johnson counter are both periodic sequences (FIG. 1 and FIG. 2 each show one period (i.e., one recurrent sequence) of the periodic sequence), the conventional Gray code is only applicable to decoded values that are powers of 2 (e.g., a 3-bit Gray code corresponds to $2^3$ decoded values (i.e., the length of the recurrent sequence is $2^3$), a 4-bit Gray code corresponds to $2^4$ decoded values (i.e., the length of the recurrent sequence is $2^4$), and so on). The conventional Johnson counter is only applicable to an even number of decoded values (e.g., a 4-bit Johnson counter corresponds to 2×4 decoded values (i.e., the length of the recurrent sequence is 2×4), a 5-bit Johnson counter corresponds to 2×5 decoded values (i.e., the length of the recurrent sequence is 2×5), and so on). The biggest disadvantage of the Johnson counter is the large area. For example: to count 16 recurrent sequences, the Johnson counter requires an 8-bit flip-flop; however, the Gray code requires only a 4-bit flip-flop.

This disadvantage limits the application range of the Gray code and the Johnson counter. For example, if a circuit originally requires only 17 levels of first-in-first-out (FIFO) memory (i.e., the memory depth is 17), it is necessary to expand the FIFO memory to 32 levels (when using the Gray code) or 18 levels (when using the Johnson counter) to ensure that each level corresponds to a decoded value, which allows for read and write operations at each level. This memory expansion is necessitated by the inability of both the Gray code and the Johnson counter to generate a recurrent sequence of length 17, leading to increased circuit costs and power consumption.

SUMMARY OF THE INVENTION

In view of the issues of the prior art, an object of the present invention is to provide a codec system, and an encoding circuit and a decoding circuit thereof, so as to make an improvement to the prior art.

An embodiment of the present invention provides a codec system that includes a conventional minimum change code generation circuit (the generated codes guarantee that there is only one bit change for each count change under certain conditions, for example, if it is the Gray code, it is applicable only to recurrent sequences whose length is a power of 2; the Johnson counter is applicable only to recurrent sequences whose length is an even number), a flag generation circuit, and a decoding circuit. The minimum change code generation circuit is configured to generate a digital code. The flag generation circuit is coupled to the minimum change code generation circuit and configured to generate a flag according to the digital code. The decoding circuit is configured to decode the digital code according to a preset value and the flag to generate an output value. The invention combines the flag and the digital code into a new code, which is applicable to any recurrent sequence length and can ensure that there is only one bit change for each count change.

Another embodiment of the present invention provides an encoding circuit that includes a minimum change code generation circuit and a flag generation circuit. The minimum change code generation circuit is configured to generate a digital code. The flag generation circuit is coupled to the minimum change code generation circuit and configured to generate a flag according to the digital code. The digital code corresponds to an output value. The output value is one of a periodic sequence. The period of the periodic sequence contains N values. The $R^{th}$ value of the first period of the periodic sequence and the $(N-R+1)^{th}$ value of the second period of the periodic sequence correspond to the same digital code, where R is greater than or equal to 1 and less than or equal to N, and the first period and the second period are consecutive periods. The flag is a first value in the first period, the flag is a second value in the second period, and the first value is not equal to the second value.

Another embodiment of the present invention provides a decoding circuit. The decoding circuit receives a digital code and a flag, and decodes the digital code and the flag to generate an output value. The decoding circuit includes a minimum change code-to-binary code conversion circuit, a subtraction circuit, and a selection circuit. The minimum change code-to-binary code conversion circuit is configured to convert the digital code into a binary code. The subtraction circuit is coupled to the minimum change code-to-binary code conversion circuit and configured to subtract the binary code from a preset value to generate a difference. The selection circuit is coupled to the minimum change code-to-binary code conversion circuit and the subtraction circuit and configured to receive the binary code and the difference, and to output the binary code or the difference as the output value according to the flag.

The technical means embodied in the embodiments of the present invention can solve at least one of the problems of the prior art. Therefore, compared to the prior art, the present invention can increase the flexibility of circuit design to save costs.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 1 shows the 3-bit Gray code and its corresponding decoded values.

FIG. 2 shows a conventional 4-bit Johnson counter and its corresponding decoded values.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a codec system and its encoding circuit and decoding circuit. On account of that some or all elements of the codec system could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 3:
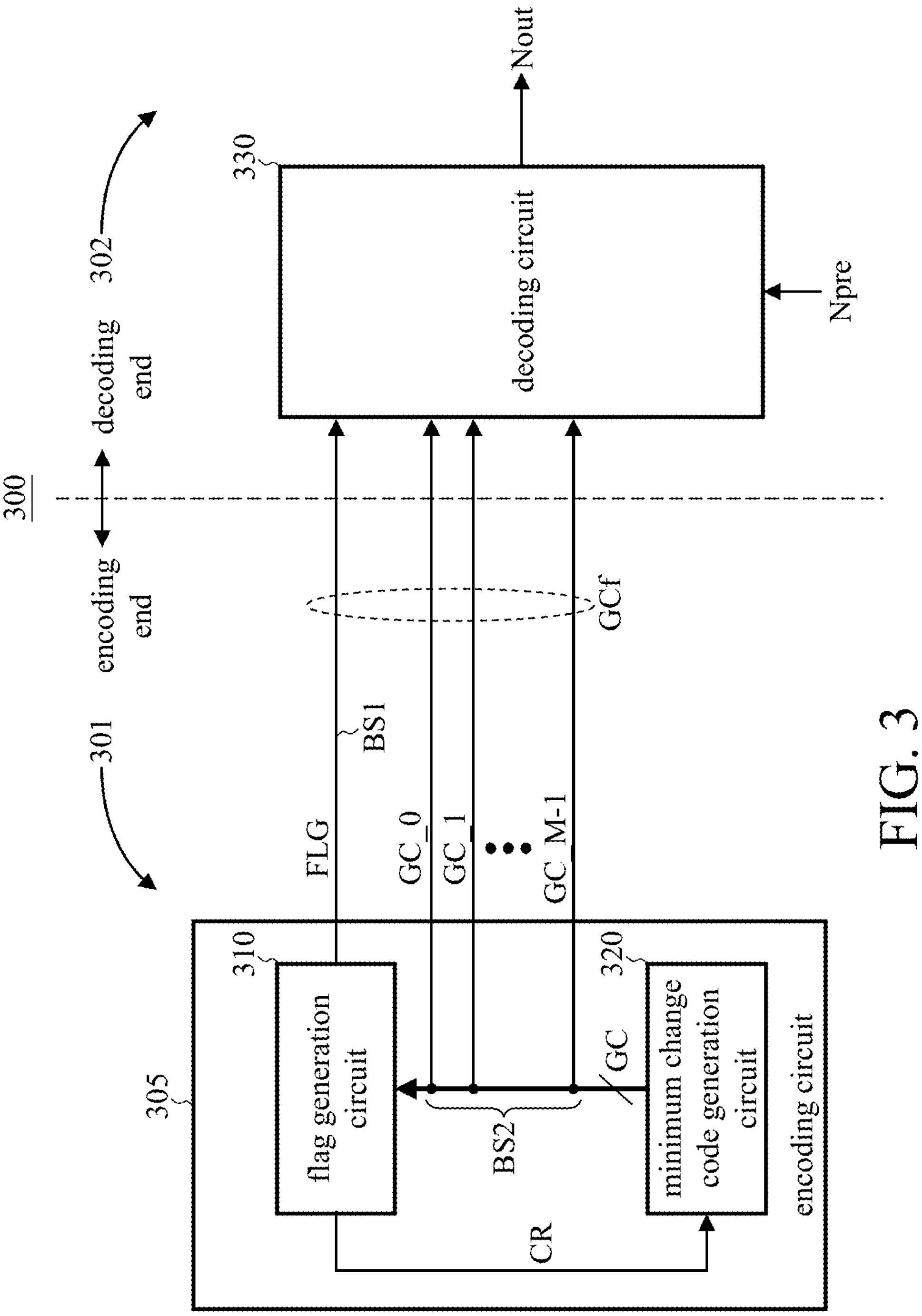
FIG. 3 is a functional block diagram of the codec system according to an embodiment of the present invention.

Reference is made to FIG. 3, which is a functional block diagram of the codec system according to an embodiment of the present invention. The codec system 300 includes an encoding end 301 and a decoding end 302. The encoding end 301 includes an encoding circuit 305. The encoding circuit 305 includes a flag generation circuit 310 and a minimum change code generation circuit 320. The decoding end 302 includes a decoding circuit 330. The flag generation circuit 310, the minimum change code generation circuit 320, and the decoding circuit 330 are coupled to each other.

The minimum change code generation circuit 320 generates a digital code GC. Because the minimum change code is a type of digital code, the minimum change code generation circuit 320 can also be referred to as a digital code generation circuit. The flag generation circuit 310 generates a flag FLG according to the digital code GC. The flag FLG is transmitted to the decoding circuit 330 via the transmission line BS1 (e.g., a trace or a bus), and the digital code GC is transmitted to the decoding circuit 330 via the transmission line BS2 (e.g., traces or a bus). The digital code GC contains M bits (GC_0, GC_1, . . . , GC_M−1), where M is a positive integer greater than 1. The flag FLG and the digital code GC together form an output code GCf, in other words, the flag FLG is one of the bits of the output code GCf.

The decoding circuit 330 decodes the output code GCf according to a preset value Npre to generate an output value Nout, which is a decoded value corresponding to an output code GCf. More specifically, the decoding circuit 330 decodes the digital code GC according to the preset value Npre and the flag FLG of the output code GCf to obtain the output value Nout.

Figure 4:
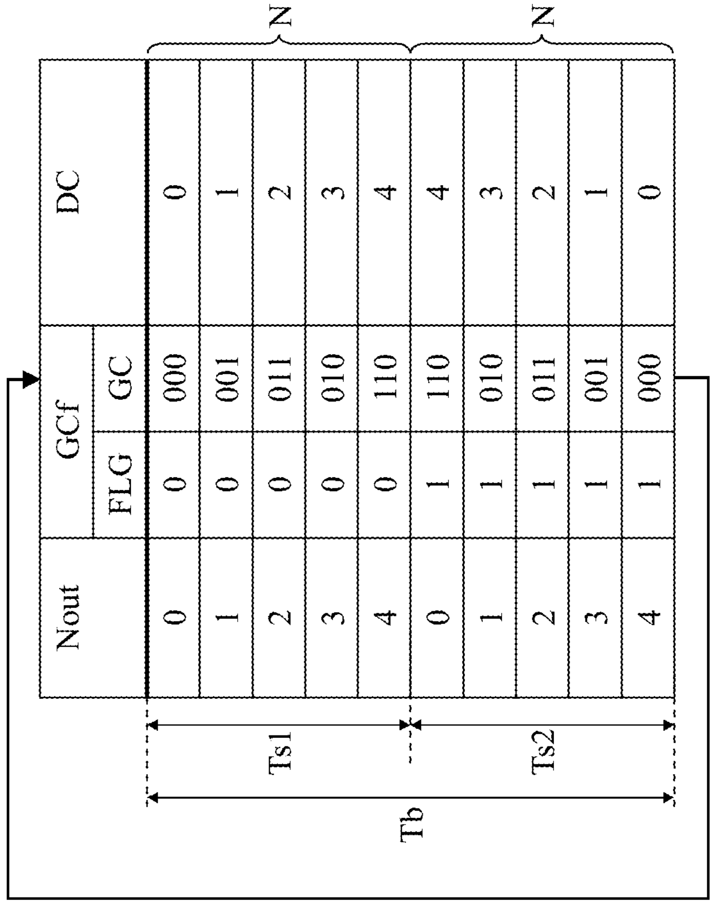
FIG. 4 shows an example of the output value Nout, the output code GCf, and the decimal number DC according to the present invention.

Reference is made to FIG. 4, which shows an example of the output value Nout, the output code GCf, and a decimal number DC according to the present invention. The fourth column "DC" is the decimal number of the digital code GC.

As shown in FIG. 4, the output value Nout, the flag FLG, the digital code GC, the output code GCf, and the decimal number DC are all periodic sequences (i.e., sequences composed of multiple recurrent sequences, with one recurrent sequence corresponding to one period of the periodic sequence). The period Tb of the flag FLG, the digital code GC, the output code GCf, and the decimal number DC is twice the period Ts (Ts1, Ts2) of the output value Nout. The period Ts1 and the period Ts2 are consecutive periods.

For the output value Nout, the length of the recurrent sequence is N (i.e., there are N values in one period Ts, and N=5 in the example of FIG. 4), and the content of the recurrent sequence (i.e., Nout[0] to Nout[N−1]) is "0, 1, 2, 3, 4."

The aforementioned preset value Npre is N−1+Nout[0]. Taking FIG. 4 as an example, the preset value Npre=5−1+0=4. In other embodiments, if the recurrent sequence of the output value Nout of the codec system 300 (i.e., Nout[0] to Nout[N−1]) is "1, 2, 3, 4, 5," then the preset value Npre of the codec system 300 is 5−1+1=5.

For the flag FLG, the length of the recurrent sequence is 2N (i.e., there are 2N values in one period Tb), and the content of the recurrent sequence (i.e., FLG[0] to FLG[2N−1]) is "0, 0, 0, 0, 0, 1, 1, 1, 1, 1." More specifically, in the first half of the period Tb (i.e., FLG[0] to FLG[N−1]), the flag FLG is a first value (which is 0 in the example of FIG. 4), and in the second half of the period Tb (i.e., FLG[N] to FLG[2N−1]), the flag FLG is a second value (which is 1 in the example of FIG. 4). The first value is not equal to the second value. In other embodiments, the first value is 1, and the second value is 0.

For the digital code GC, the length of the recurrent sequence is 2N (i.e., there are 2N values in one period Tb), and the content of the recurrent sequence (i.e., GC[0] to GC[2N−1]) is "000, 001, 011, 010, 110, 110, 010, 011, 001, 000."

For the decimal number DC, the length of the recurrent sequence is 2N (i.e., there are 2N values in one period Tb), and the content of the recurrent sequence (i.e., DC[0] to DC[2N−1]) is "0, 1, 2, 3, 4, 4, 3, 2, 1, 0."

For the digital code GC and the decimal number DC, the first half of the recurrent sequence is the mirroring of the second half of the sequence, and vice versa. More specifically, the $K^{th}$ value of the recurrent sequence is equal to the $(2N+1-K)^{th}$ value of the recurrent sequence ($1 \le K \le 2N$), that is, GC[K−1]=GC[2N−1−(K−1)] and DC[K−1]=DC[2N−1−(K−1)].

Continuing the previous paragraph, from the perspective of the output value Nout, the $R^{th}$ value of the period Ts1 and the (N−R+1)$^{th}$ value of the period Ts2 correspond to the same digital code GC (1≤R≤N). For example (referring to FIG. 4, where N=5), when R is 2, the second value of the period Ts1 (Nout[1]=1) and the fourth (=5−2+1) value of the period Ts2 (Nout[3]−3) both correspond to the digital code GC=001.

Please continue to refer to FIG. 4. Because the period of the output value Nout is the period Ts, the R$^{th}$ output value Nout of the period Ts1 is equal to the R$^{th}$ output value Nout of the period Ts2. It should be noted that the flag FLG is 0 and 1 in the periods Ts1 and Ts2, respectively.

Continuing the previous paragraph, in most cases (except for R=(N+1)/2, where Nis an odd number), the R$^{th}$ output value Nout of the period Ts1 and the R$^{th}$ output value Nout of the period Ts2 correspond to different digital codes GC. For example, the second output value Nout of the period Ts1 (Nout[1]=1) corresponds to the digital code GC[1]=001, while the second output value Nout of the period Ts2 (Nout[1]=1) corresponds to the digital code GC[6]=010.

In summary, the output code GCf is the minimum change code, the lengths of the recurrent sequences of the flag FLG and the digital code GC are both 2N, and the length of the recurrent sequence of the output value Nout is N. In other words, a value of the output value Nout may correspond to two values of the output code GCf. For example, the output value Nout=0 (Nout[0]) may correspond to the output code GCf=0000 (GCf[0]) or 1110 (GCf[5]). The output value Nout=1 (Nout[1]) may correspond to the output code GCf=0001 (GCf[1]) or 1010 (GCf[6]); and so on. It can be observed that the present invention generates the output value Nout based on the minimum change code, and the length (N) of the recurrent sequence of the output value Nout does not have to be a power of 2 or an even number, greatly enhancing the flexibility of circuit design.

Figure 5:
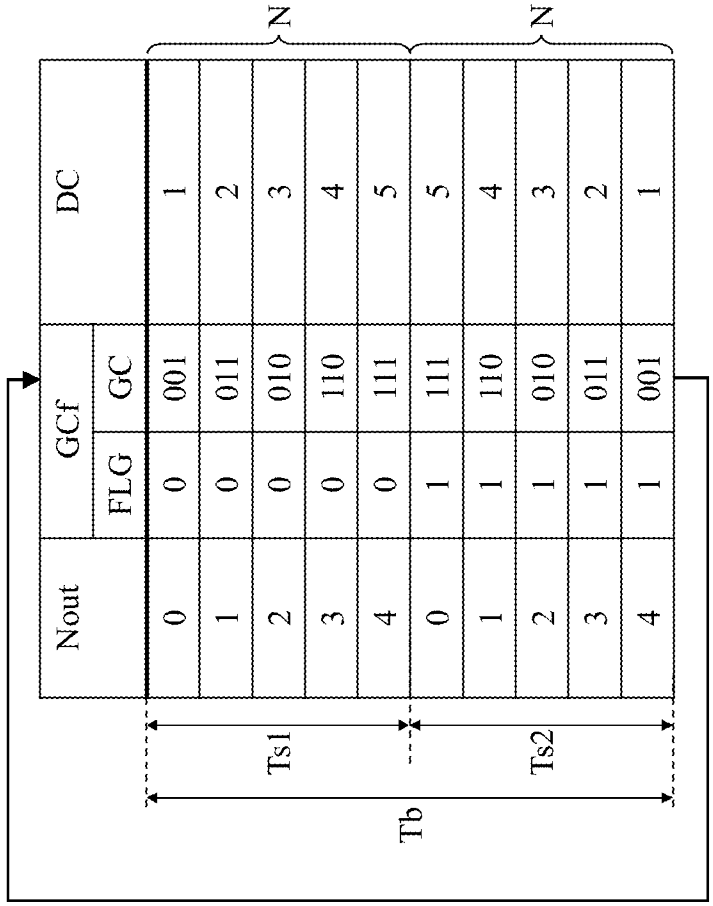
FIG. 5 shows another example of the output value Nout, the output code GCf, and the decimal number DC according to the present invention.

Reference is made to FIG. 5, which shows another example of the output value Nout, the output code GCf, and the decimal number DC of the present invention. FIG. 5 is similar to FIG. 4, except that the content of the recurrent sequence of the digital code GC (i.e., GC[0] to GC[2N−1]) is "001, 011, 010, 110, 111, 111, 110, 010, 011, 001," while the content of the recurrent sequence of the decimal number DC (i.e., DC[0] to DC[2N−1]) is "1, 2, 3, 4, 5, 5, 4, 3, 2, 1." It should be noted that the minimum value of the digital code GC in FIG. 5 (i.e., GC[0]) is not the minimum value of the conventional Gray code ("000"), but the output code GCf in FIG. 5 is still the minimum change code.

Figure 6:
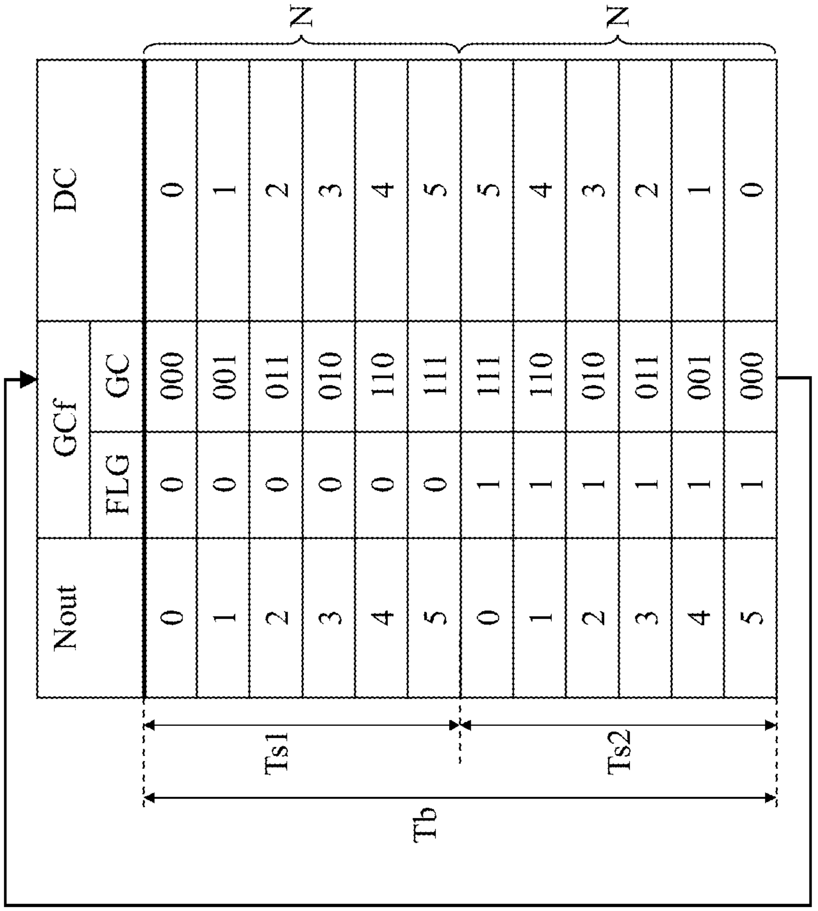
FIG. 6 shows an example of the output value Nout, the output code GCf, and the decimal number DC according to the present invention.

Reference is made to FIG. 6, which shows another example of the output value Nout, the output code GCf, and the decimal number DC of the present invention. FIG. 6 is similar to FIG. 4, except that N is 6 in FIG. 6. In other words, the length of the recurrent sequence of the output value Nout of the present invention may also be an even number.

Reference is made to both FIG. 4 and FIG. 6. The minimum values of the digital code GC (i.e., GC[0]) are the same, but the lengths (i.e., N) of the recurrent sequence of the output value Nout are different. In FIG. 4, the output value Nout=2 (i.e., Nout[2]) corresponds to the output code GCf=0011 (i.e., GCf[2], the first output code) or 1011 (i.e., GCf[7], the second output code). In FIG. 6, the output value Nout=2 (i.e., Nout[2]) corresponds to the output code GCf=0011 (i.e., GCf[2], the third output code) or 1010 (i.e., GCf[8], the fourth output code). It should be noted that the first output code is equal to the third output code, but the second output code is different from the fourth output code. In other words, when the minimum values of the digital code GC (i.e., GC[0]) are the same, the length (N) of the recurrent sequence of the output value Nout affects the correspondence between the output value Nout and the output code GCf.

It can be observed from FIG. 4 to FIG. 6 that one half of the digital code GC of the present invention (i.e., GC[0] to GC[N−1] or GC[N] to GC[2N−1]) is a continuous sequence of N values from a conventional minimum change code (e.g., the Gray code). It can be observed from FIG. 4 and FIG. 5 that the minimum value of the digital code GC (GC[0]) is not necessarily the minimum value of the conventional minimum change code.

Figure 7:
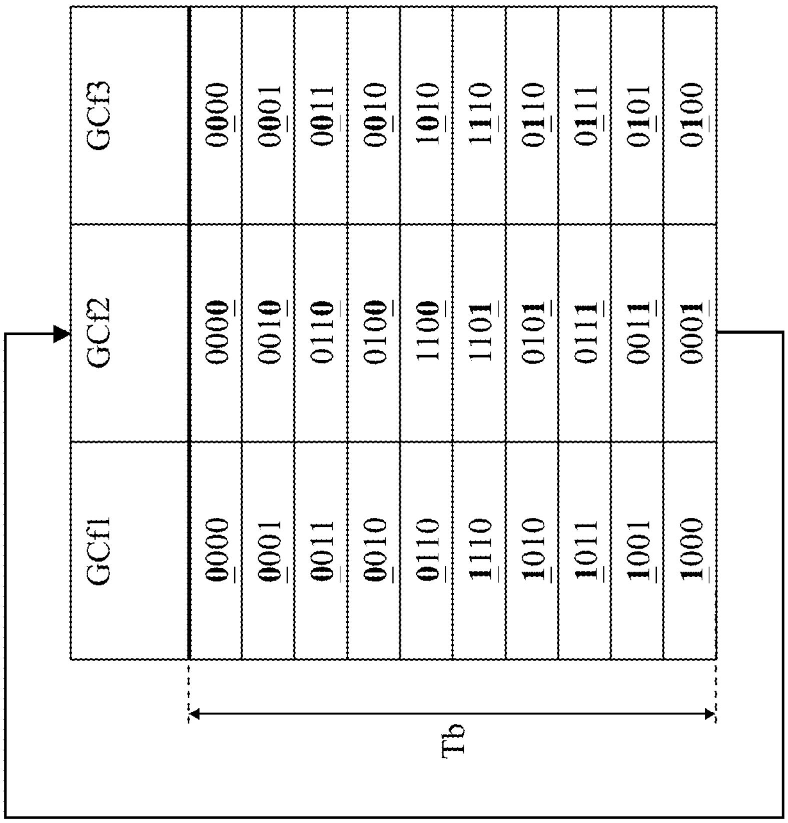
FIG. 7 shows different examples of the output code GCf according to the present invention.

Reference is made to FIG. 7, which shows different examples of the output code GCf of the present invention. As discussed above, the output code GCf is a combination of the flag FLG and the digital code GC, and the flag FLG may be arranged at any bit of the output code GCf. In FIG. 7, the underlined bits are the flag FLG. For example, the flag FLG may be the most significant bit (MSB) of the output code GCf (e.g., the output code GCf1 in the leftmost column of FIG. 7), the least significant bit (LSB) (e.g., the output code GCf2 in the middle column of FIG. 7), or the middle bit (e.g., the output code GCf3 in the rightmost column of FIG. 7).

Figure 8:
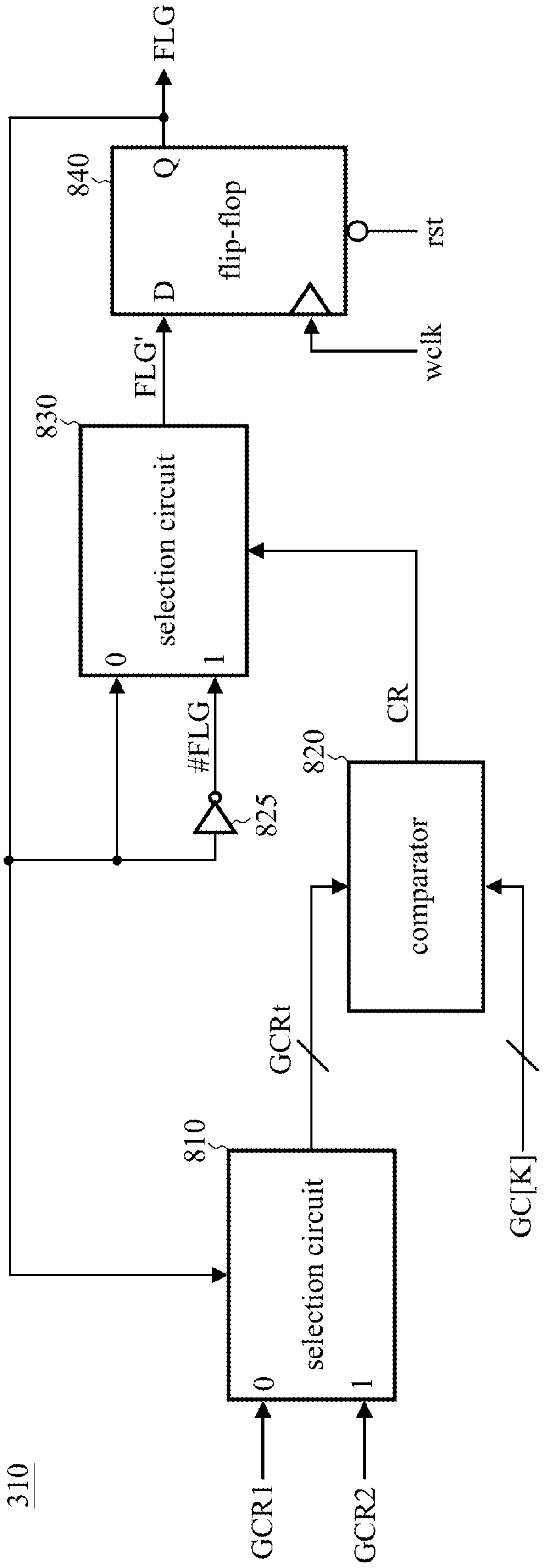
FIG. 8 is a functional block diagram of the flag generation circuit 310 according to an embodiment of the present invention.

Reference is made to FIG. 8, which is a functional block diagram of the flag generation circuit 310 according to an embodiment of the present invention. The flag generation circuit 310 includes a selection circuit 810, a comparator 820, an inverter 825, a selection circuit 830, and a flip-flop 840. The selection circuit 810, the comparator 820, the inverter 825, the selection circuit 830, and the flip-flop 840 are coupled to each other.

The selection circuit 810 receives the reference code GCR1 and the reference code GCR2 and inputs one of the two as the target reference code GCRt according to the flag FLG. The reference code GCR1 is the maximum value of the recurrent sequence of the digital code GC (i.e., GC[N−1] or GC[N]), and the reference code GCR2 is the minimum value of the recurrent sequence of the digital code GC (i.e., GC[0] or GC[2N−1]). More specifically, when the flag FLG is at the first level, the target reference code GCRt equals the reference code GCR1. When the flag FLG is at the second level, the target reference code GCRt equals the reference code GCR2. In one embodiment, the first level may be 0, and the second level may be 1.

The comparator 820 compares the current digital code GC[K] with the target reference code GCRt to generate the comparison result CR. More specifically, when the current digital code GC[K] is equal to (or not equal to) the target reference code GCRt, the comparison result CR is 1 (or 0).

The selection circuit 830 receives the flag FLG and the inverted signal #FLG of the flag FLG and outputs one of the two as the next flag FLG' according to the comparison result CR. More specifically, when the comparison result CR is 0, the next flag FLG' is equal to the flag FLG (i.e., the flag FLG is not updated). When the comparison result CR is 1, the next flag FLG' is equal to the inverted signal #FLG (i.e., the flag FLG is updated).

The flip-flop 840 is used to temporarily store the flag FLG. More specifically, the flip-flop 840 outputs the next flag FLG' according to the clock wclk to replace the current flag FLG. The flip-flop 840 is reset according to the reset signal rst.

Figure 9:
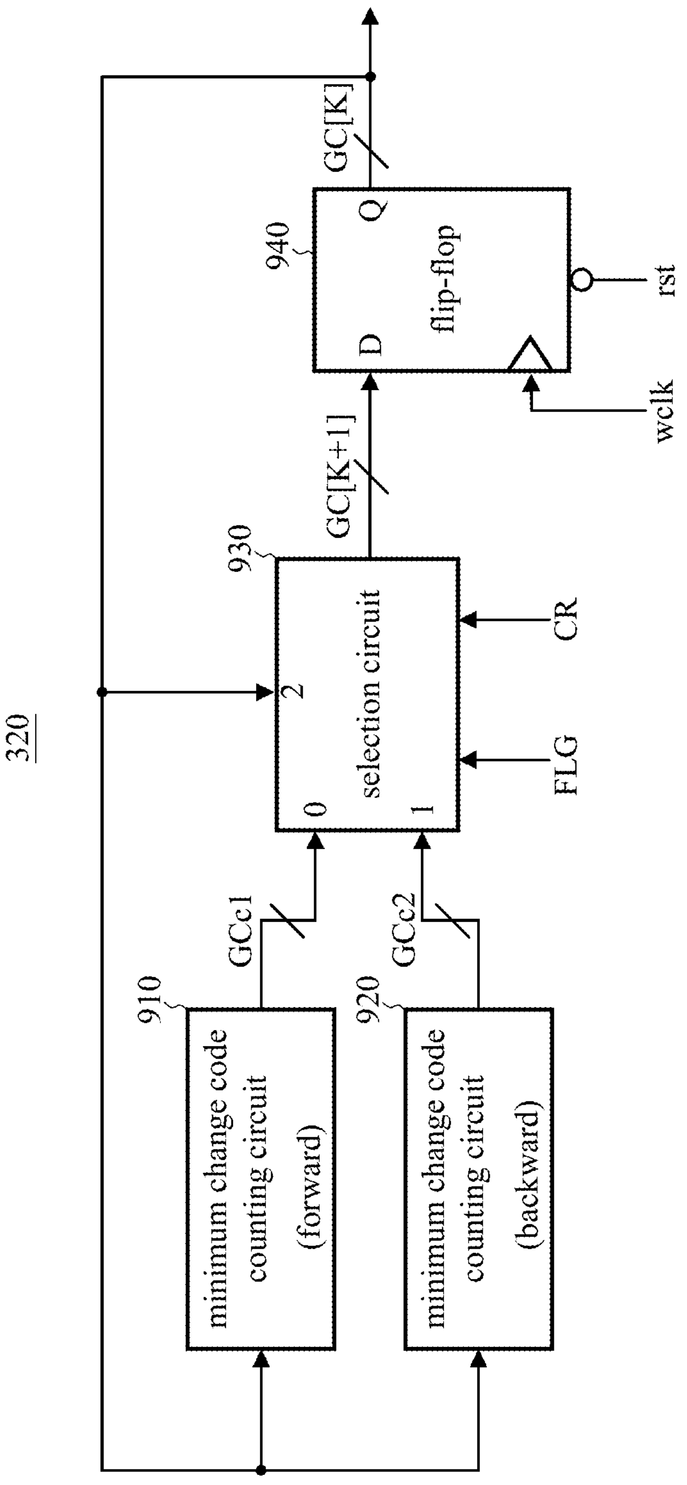
FIG. 9 is a functional block diagram of the minimum change code generation circuit according to an embodiment of the present invention.

Reference is made to FIG. 9, which is a functional block diagram of the minimum change code generation circuit according to an embodiment of the present invention. The minimum change code generation circuit 320 includes a minimum change code counting circuit 910, a minimum change code counting circuit 920, a three-to-one selection circuit 930, and a group of flip-flops 940. The minimum change code counting circuit 910, the minimum change code counting circuit 920, the selection circuit 930, and the flip-flop 940 are coupled to each other.

Based on the current digital code GC[K], the minimum change code counting circuit 910 and the minimum change code counting circuit 920 respectively generate a candidate digital code GCc1 and a candidate digital code GCc2 according to a first order (forward) and a second order (backward). Taking FIG. 4 as an example, the first order is the conventional Gray code in forward order (i.e., the content of the candidate digital code GCc1 is 000→001→011→010→110→000→001→ . . . ), while the second order is the conventional Gray code in backward order (i.e., the content of the candidate digital code GCc2 is 110→010→011→001→000→110→010→ . . . ). For example, when the current digital code GC[K] is equal to 011, the candidate digital code GCc1 and the candidate digital code GCc2 are 010 and 001, respectively.

The selection circuit 930 receives the current digital code GC[K], the candidate digital code GCc1, and the candidate digital code GCc2 and outputs one of the three as the next digital code GC[K+1] according to the flag FLG and the comparison result CR of FIG. 8. For example (referring to FIG. 4), when the flag FLG=0, the comparison result CR=0, and the current digital code GC[K]=011, the next digital code GC[K+1] is equal to the candidate digital code GCc1, which is 010. When the flag FLG=1, the comparison result CR=0, and the current digital code GC[K]=011, the next digital code GC[K+1] is equal to the candidate digital code GCc2, which is 001. When the comparison result CR=1, regardless of the value of the flag FLG, the selection circuit 930 outputs the current digital code GC[K] (i.e., GC[K+1]-GC[K]). This allows the digital code GC to remain unchanged for an additional period (cycle) when the flag FLG transitions, that is, GC[N−1]=GC[N]=110 or GC[2N−1]=GC[2N]=000.

The flip-flops 940 are used to temporarily store the next digital code GC[K+1]. More specifically, the flip-flops 940 outputs the next digital code GC[K+1] according to the clock wclk to replace the current digital code GC[K]. The flip-flops 940 are reset according to the reset signal rst.

Figure 10:
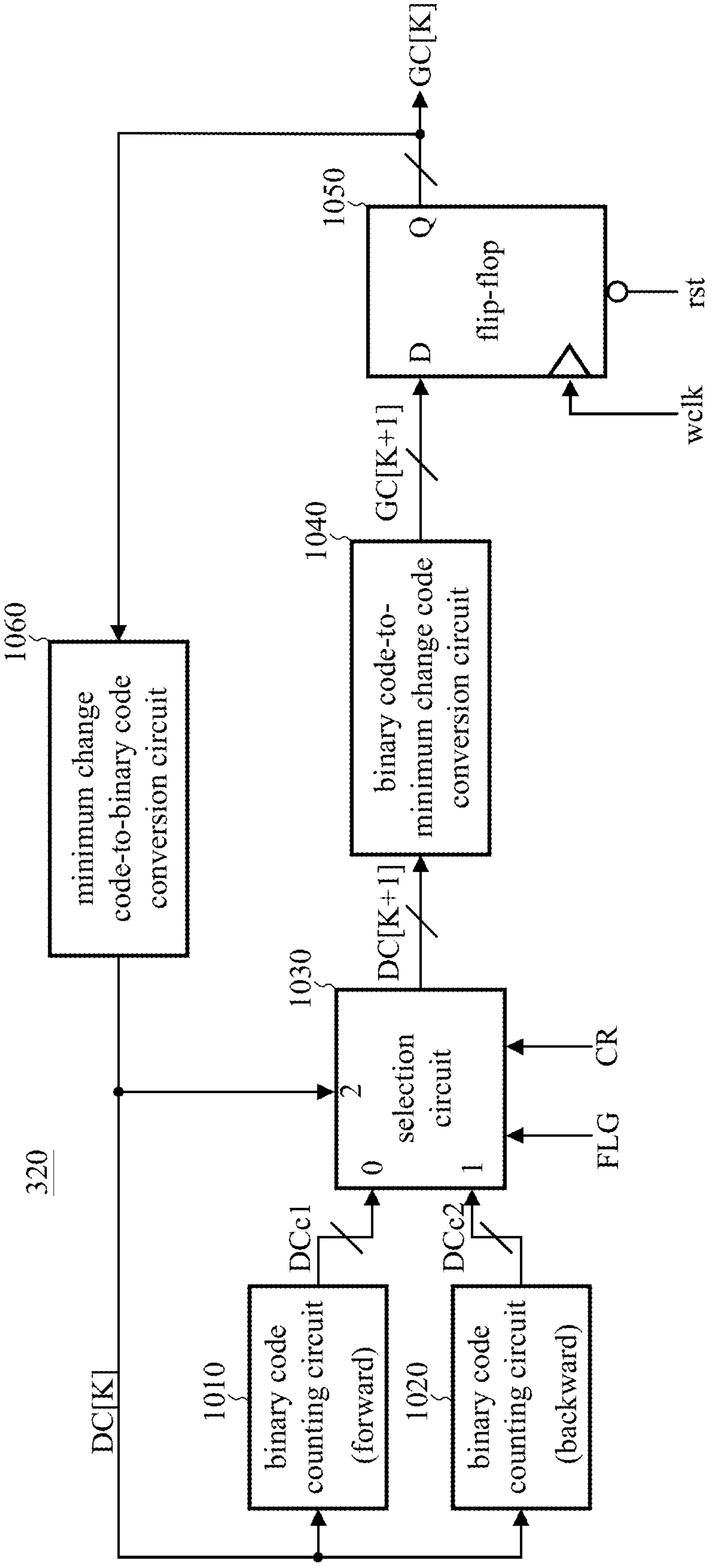
FIG. 10 is a functional block diagram of the minimum change code generation circuit 320 according to another embodiment of the present invention.

Reference is made to FIG. 10, which is a functional block diagram of the minimum change code generation circuit 320 according to another embodiment of the present invention. The minimum change code generation circuit 320 includes a binary code counting circuit 1010, a binary code counting circuit 1020, a selection circuit 1030, a binary code-to-minimum change code conversion circuit 1040, a group of flip-flops 1050, and a minimum change code-to-binary code conversion circuit 1060. The binary code counting circuit 1010, the binary code counting circuit 1020, the selection circuit 1030, the binary code-to-minimum change code conversion circuit 1040, the flip-flops 1050, and the minimum change code-to-binary code conversion circuit 1060 are coupled to each other.

The minimum change code-to-binary code conversion circuit 1060 is used to convert the current digital code GC[K] into the current binary code DC[K] (i.e., the binary code corresponding to the decimal number DC).

Based on the current binary code DC[K], the binary code counting circuit 1010 and the binary code counting circuit 1020 respectively generate the candidate binary code DCc1 and the candidate binary code DCc2 according to the first order (forward) and the second order (backward). Taking FIG. 4 as an example, the first order is the conventional binary code in forward order (i.e., the content of the candidate binary code DCc1 is 000→001→010→011→100→000→001→ . . . ), and the second order is the conventional binary code in backward order (i.e., the content of the candidate binary code DCc2 is 100→011→010→001→000→100→011→ . . . ). For example, when the current binary code DC[K] is equal to 010, the candidate binary code DCc2 and the candidate binary code DCc2 are 011 and 001, respectively.

The selection circuit 1030 receives the current binary code DC[K], the candidate binary code DCc1, and the candidate binary code DCc2 and outputs one of the three as the next binary code DC[K+1] according to the flag FLG and the comparison result CR of FIG. 8. For example (referring to FIG. 4), when the flag FLG=0, the comparison result CR=0, and the current binary code DC[K]=2 (010), the next binary code DC[K+1] is equal to the candidate binary code DCc1, which is 3 (011). When the flag FLG=1, the comparison result CR=0, and the current binary code DC[K]=2 (010), the next binary code DC[K+1] is equal to the candidate binary code DCc2, which is 1 (001). When the comparison result CR=1, regardless of the value of the flag FLG, the selection circuit 1030 outputs the current binary code DC[K]. When the comparison result CR=1, a final result of GC[K+1]−GC[K] is obtained after the operations of the binary code-to-minimum change code conversion circuit 1040 and the flip-flop 1050. This allows the digital code GC to remain unchanged for an additional period (cycle) when the flag FLG transitions, that is, GC[N−1]=GC[N]=110 or GC[2N−1]=GC[2N]=000.

The binary code-to-minimum change code conversion circuit 1040 is used to convert the next binary code DC[K+1] into the minimum change code (i.e., the next digital code GC[K+1]).

The flip-flops 1050 are used to temporarily store the next digital code GC[K+1]. More specifically, the flip-flops 1050 outputs the next digital code GC[K+1] according to the clock wclk to replace the current digital code GC[K]. The flip-flops 1050 are reset according to the reset signal rst.

Figure 11:
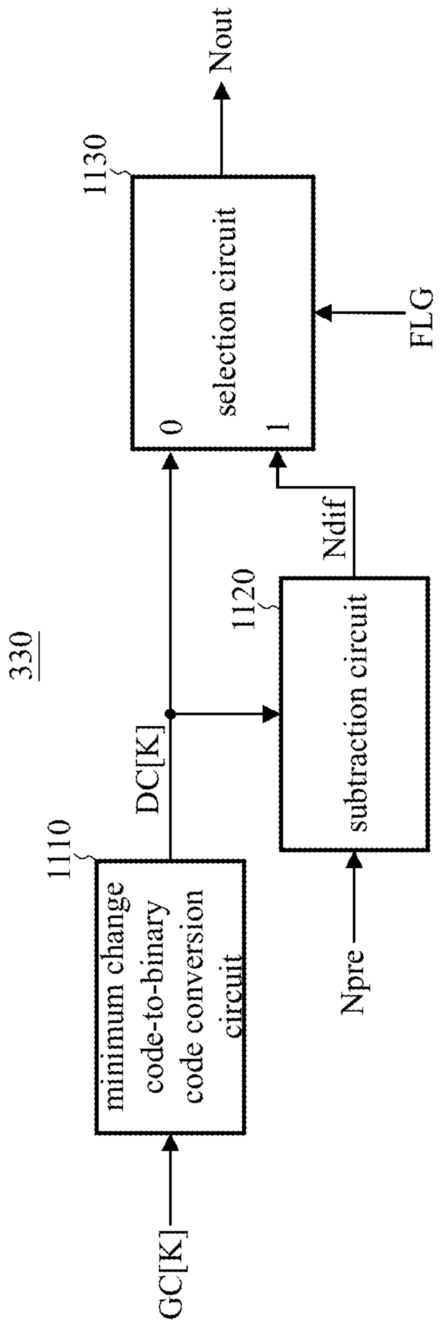
FIG. 11 is a functional block diagram of the decoding circuit 330 according to an embodiment of the present invention.

Reference is made to FIG. 11, which is a functional block diagram of the decoding circuit 330 according to an embodiment of the present invention. The decoding circuit 330 includes a minimum change code-to-binary code conversion circuit 1110, a subtraction circuit 1120, and a selection circuit 1130. The minimum change code-to-binary code conversion circuit 1110, the subtraction circuit 1120, and the selection circuit 1130 are coupled to each other.

The minimum change code-to-binary code conversion circuit 1110 is used to convert the current digital code GC[K] into the current binary code DC[K].

The subtraction circuit 1120 is used to subtract the current binary code DC[K] from the preset value Npre to obtain the difference Ndif (Ndif=Npre−DC[K]).

The selection circuit 1130 receives the current binary code DC[K] and the difference Ndif and outputs one of the two as the output value Nout according to the flag FLG. For example (referring to FIG. 4), when the flag FLG=0 and the current digital code GC[K]=011, the output value Nout is the current binary code DC[K], which is 2. When the flag FLG=1 and the current digital code GC[K]=011, the output value Nout=Ndif=Npre−DC[K]=4−2=2.

The selection circuits 810, 830, 930, 1030, and 1130 may be embodied by a multiplexer.

Figure 12:
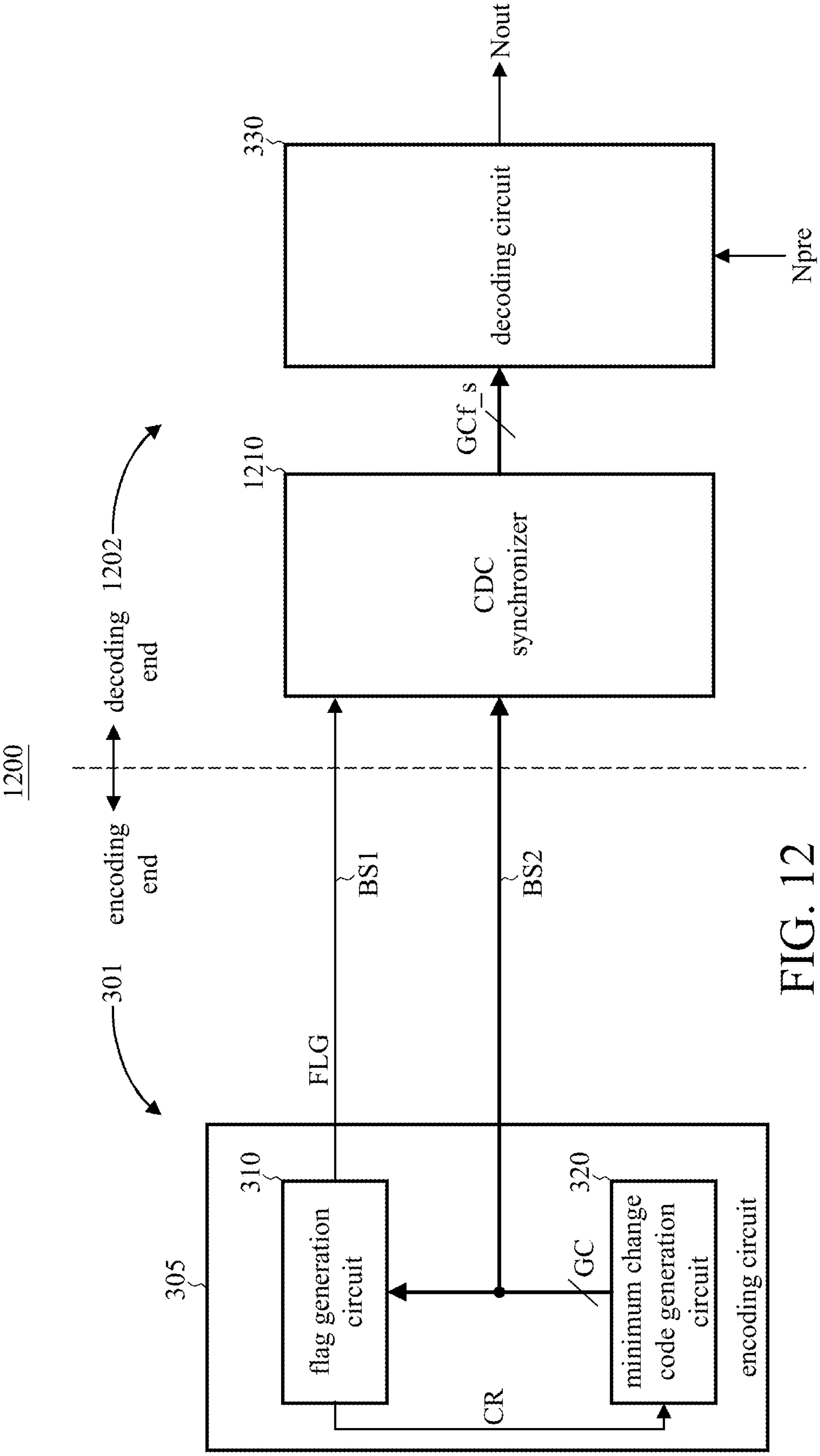
FIG. 12 is a schematic diagram of the codec system of the present invention as applied to an asynchronous first-in-first-out (FIFO) memory.

The present invention can significantly improve the flexibility of circuit design. For example, the present invention may be applied to an asynchronous FIFO design. Reference is made to FIG. 12, which is a schematic diagram of the codec system of the present invention as applied to an asynchronous FIFO design. The codec system 1200 includes the encoding end 301 and a decoding end 1202. Since the encoding end 301 is the same as the encoding end 301 in FIG. 3, further elaboration is omitted for brevity.

The decoding end 1202 includes a clock domain crossing (CDC) synchronizer 1210 and a decoding circuit 330. The CDC synchronizer 1210 and the decoding circuit 330 are coupled to each other. The CDC synchronizer 1210 is used to synchronize the output code GCf to generate the synchronized output code GCf_s. Since the design and operating principles of the CDC synchronizer 1210 are well known to people having ordinary skill in the art, further elaboration is omitted for brevity. The decoding circuit 330 is substantially the same as the decoding circuit 330 in FIG. 3.

When the codec system 1200 is applied to an asynchronous FIFO design, the encoding end 301 may be a part of the read (write) address generation circuit and configured to generate the read (write) pointer, and the decoding end 1202 may be a part of the write (read) circuit and configured to write (read) the FIFO memory according to the write (read) pointer. For example, when the output value Nout (=R) is used as the write pointer, it indicates data have been written to the FIFO memory at an address R, and the read circuit can determine whether there is data to be read in the FIFO memory according to the output value Nout. The depth of the FIFO memory is the length of the recurrent sequence of the output value Nout (i.e., N) $(0 \leq R \leq (N-1))$.

Figure 13:
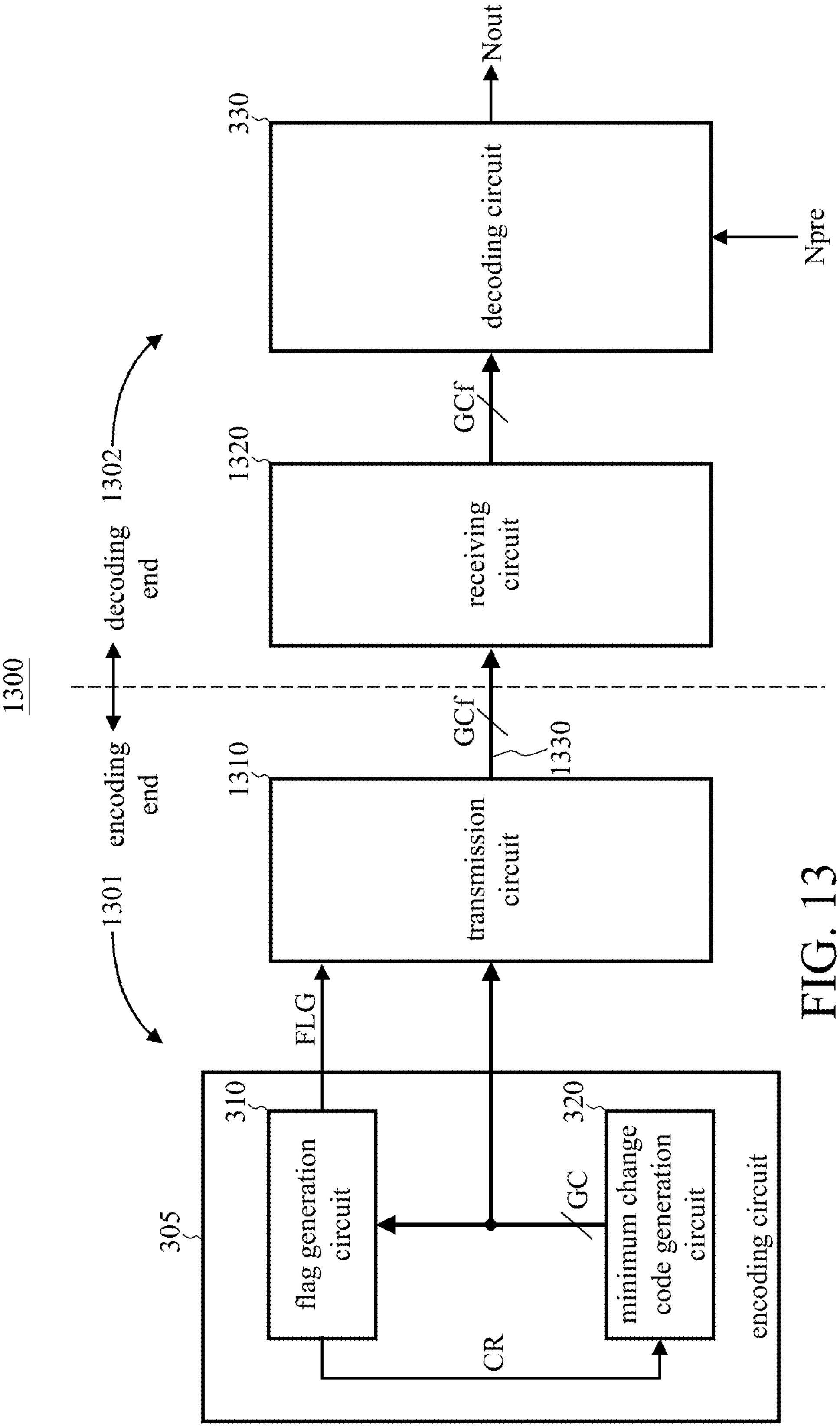
FIG. 13 is a functional block diagram of the codec circuit according to another embodiment of the present invention.

In other embodiments, the encoding end and the decoding end of the codec circuit of the present invention may be on different devices. Reference is made to FIG. 13, which is a functional block diagram of the codec circuit according to another embodiment of the present invention. The codec circuit 1300 includes an encoding end 1301 and a decoding end 1302. The encoding end 1301 includes the encoding circuit 305 and a transmission circuit 1310. The decoding end 1302 includes a receiving circuit 1320 and the decoding circuit 330. The transmission circuit 1310 transmits the output code GCf to the receiving circuit 1320 through a transmission medium 1330. The transmission medium 1330 may be a physical transmission line (wired transmission) or air (wireless transmission). For example, the encoding end 1301 may be implemented at the transmitting end of a digital communication system (e.g., digital terrestrial television or cable TV), and the decoding end 1302 may be implemented at the receiving end of the digital communication system. The codec circuit 1300 may be used for error correction, ensuring the accuracy of data transmission.

Various functional components or blocks have been described herein. As appreciated by persons skilled in the art, in some embodiments, the functional blocks can preferably be implemented through circuits (either dedicated circuits, or general purpose circuits, which operate under the control of one or more processors and coded instructions), which typically comprise transistors or other circuit elements that are configured in such a way as to control the operation of the circuitry in accordance with the functions and operations described herein. As further appreciated by persons skilled in the art, the specific structure or interconnections of the circuit elements can typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A codec system, comprising:

a minimum change code generation circuit configured to generate a digital code;

a flag generation circuit coupled to the minimum change code generation circuit and configured to generate a flag based on the digital code; and a decoding circuit configured to decode the digital code according to a preset value and the flag to generate an output value.

2. The codec system of claim 1, wherein the digital code is one of a periodic sequence, and when the digital code is equal to a maximum value or a minimum value of the periodic sequence, the flag generation circuit changes the flag.

3. The codec system of claim 1, wherein the output value is one of a periodic sequence, a period of the periodic sequence comprises N values, an $R^{th}$ value of a first period of the periodic sequence and an $(N-R+1)^{th}$ value of a second period of the periodic sequence correspond to a same digital code, the first period and the second period are consecutive periods, the flag is a first value in the first period, the flag is a second value in the second period, the first value is not equal to the second value, and R is greater than or equal to one and less than or equal to N.

4. The codec system of claim 1, wherein the output value is one of a periodic sequence, a period of the periodic sequence comprises N values, an $R^{th}$ value of a first period of the periodic sequence is equal to the $R^{th}$ value of a second period of the periodic sequence, the first period and the second period are consecutive periods, the flag is a first value in the first period, the flag is a second value in the second period, the first value is not equal to the second value, and R is greater than or equal to one and less than or equal to N.

5. The codec system of claim 4, wherein the $R^{th}$ value of the first period and the $R^{th}$ value of the second period correspond to different digital codes except for R=(N+1)/2 where N is odd number.

6. The codec system of claim 1, wherein the output value is one of a periodic sequence, a period of the periodic sequence comprises N values, an $R^{th}$ value of a first period of the periodic sequence and the $R^{th}$ value of a second period of the periodic sequence corresponds to different digital codes except for R=(N+1)/2 where Nis odd number, the first period and the second period are consecutive periods, and R is greater than or equal to one and less than or equal to N.

7. The codec system of claim 1, wherein the flag generation circuit comprises:

a first selection circuit configured to receive a first reference code and a second reference code and output the first reference code or the second reference code as a target reference code according to the flag;

a comparator coupled to the first selection circuit and configured to compare the digital code and the target reference code to generate a comparison result; and a second selection circuit coupled to the comparator and configured to receive the flag and an inverted signal of the flag and output the flag or the inverted signal of the flag according to the comparison result.

8. The codec system of claim 7, wherein the minimum change code generation circuit comprises:

a first minimum change code counting circuit configured to generate a first candidate digital code according to a first order and the digital code;

a second minimum change code counting circuit configured to generate a second candidate digital code according to a second order and the digital code, wherein the second order is different from the first order; and a selection circuit coupled to the first minimum change code counting circuit and the second minimum change code counting circuit and configured to receive the digital code, the first candidate digital code, and the second candidate digital code, and to output the digital code, the first candidate digital code, or the second candidate digital code according to the flag and the comparison result.

9. The codec system of claim 7, wherein the minimum change code generation circuit comprises:

a minimum change code-to-binary code conversion circuit configured to convert the digital code into a first binary code;

a first binary code counting circuit coupled to the minimum change code-to-binary code conversion circuit and configured to generate a first candidate binary code according to a first order and the first binary code;

a second binary code counting circuit coupled to the minimum change code-to-binary code conversion circuit and configured to generate a second candidate binary code according to a second order and the first binary code, wherein the second order is different from the first order;

a selection circuit coupled to the first binary code counting circuit and the second binary code counting circuit and configured to receive the first binary code, the first candidate binary code, and the second candidate binary code, and to output the first binary code, the first candidate binary code, or the second candidate binary code as a second binary code according to the flag and the comparison result; and a binary code-to-minimum change code conversion circuit coupled to the selection circuit and configured to convert the second binary code into a minimum change code.

10. The codec system of claim 1, wherein the decoding circuit comprises:

a minimum change code-to-binary code conversion circuit configured to convert the digital code into a binary code;

a subtraction circuit coupled to the minimum change code-to-binary code conversion circuit and configured to subtract the binary code from the preset value to generate a difference; and a selection circuit coupled to the minimum change code-to-binary code conversion circuit and the subtraction circuit and configured to receive the binary code and the difference, and to output the binary code or the difference as the output value according to the flag.

11. The codec system of claim 1, wherein the output value is one of a periodic sequence, a period of the periodic sequence comprises N values, and the preset value is equal to N−1.

12. An encoding circuit, comprising:

a minimum change code generation circuit configured to generate a digital code; and a flag generation circuit coupled to the minimum change code generation circuit and configured to generate a flag based on the digital code;

wherein the digital code corresponds to an output value, the output value is one of a periodic sequence, a period of the periodic sequence comprises N values, an $R^{th}$ value of a first period of the periodic sequence and an $(N-R+1)^{th}$ value of a second period of the periodic sequence correspond to a same digital code, the first period and the second period are consecutive periods, the flag is a first value in the first period, the flag is a second value in the second period, the first value is not equal to the second value, and R is greater than or equal to one and less than or equal to N.

13. The encoding circuit of claim 12, wherein the digital code is one of a periodic sequence, and when the digital code is equal to a maximum value or a minimum value of the periodic sequence, the flag generation circuit changes the flag.

14. The encoding circuit of claim 12, wherein the $R^{th}$ value of the first period and the $R^{th}$ value of the second period correspond to different digital codes except for $R=(N+1)/2$ where N is odd number.

15. The encoding circuit of claim 12, wherein the flag generation circuit comprises:

a first selection circuit configured to receive a first reference code and a second reference code and output the first reference code or the second reference code as a target reference code according to the flag;

a comparator coupled to the first selection circuit and configured to compare the digital code and the target reference code to generate a comparison result; and a second selection circuit coupled to the comparator and configured to receive the flag and an inverted signal of the flag and output the flag or the inverted signal of the flag according to the comparison result.

16. The encoding circuit of claim 15, wherein the minimum change code generation circuit comprises:

a first minimum change code counting circuit configured to generate a first candidate digital code according to a first order and the digital code;

a second minimum change code counting circuit configured to generate a second candidate digital code according to a second order and the digital code, wherein the second order is different from the first order; and a selection circuit coupled to the first minimum change code counting circuit and the second minimum change code counting circuit and configured to receive the digital code, the first candidate digital code, and the second candidate digital code, and to output the digital code, the first candidate digital code, or the second candidate digital code according to the flag and the comparison result.

17. The encoding circuit of claim 15, wherein the minimum change code generation circuit comprises:

a minimum change code-to-binary code conversion circuit configured to convert the digital code into a first binary code;

a first binary code counting circuit coupled to the minimum change code-to-binary code conversion circuit and configured to generate a first candidate binary code according to a first order and the first binary code;

a second binary code counting circuit coupled to the minimum change code-to-binary code conversion circuit and configured to generate a second candidate binary code according to a second order and the first binary code, wherein the second order is different from the first order;

a selection circuit coupled to the first binary code counting circuit and the second binary code counting circuit and configured to receive the first binary code, the first candidate binary code, and the second candidate binary code, and to output the first binary code, the first candidate binary code, or the second candidate binary code as a second binary code according to the flag and the comparison result; and a binary code-to-minimum change code conversion circuit coupled to the selection circuit and configured to convert the second binary code into a minimum change code.

18. A decoding circuit, wherein the decoding circuit receives a digital code and a flag and decodes the digital code and the flag to generate an output value, the decoding circuit comprising:

a minimum change code-to-binary code conversion circuit configured to convert the digital code into a binary code;

a subtraction circuit coupled to the minimum change code-to-binary code conversion circuit and configured to subtract the binary code from a preset value to generate a difference; and a selection circuit coupled to the minimum change code-to-binary code conversion circuit and the subtraction circuit and configured to receive the binary code and the difference, and to output the binary code or the difference as the output value according to the flag.

19. The decoding circuit of claim 18, wherein the output value is one of a periodic sequence, a period of the periodic sequence comprises N values, and the preset value is equal to N−1.

20. The decoding circuit of claim 18, wherein the output value is one of a periodic sequence, a period of the periodic sequence comprises N values, an $R^{th}$ value of a first period of the periodic sequence and an $(N-R+1)^{th}$ value of a second period of the periodic sequence correspond to a same digital code, the first period and the second period are consecutive periods, the flag is a first value in the first period, the flag is a second value in the second period, the first value is not equal to the second value, and R is greater than or equal to one and less than or equal to N.

* * * * *